(12) United States Patent
Ishii

(10) Patent No.: US 7,006,803 B2
(45) Date of Patent: Feb. 28, 2006

(54) POWER AMPLIFICATION CIRCUIT FOR COMMUNICATION DEVICE

(75) Inventor: Katsuhiro Ishii, Tokyo (JP)

(73) Assignee: NEC Corporation, Tokyo (JP)

( * ) Notice: Subject to any disclaimer, the term of this patent is extended or adjusted under 35 U.S.C. 154(b) by 765 days.

(21) Appl. No.: 09/875,819

(22) Filed: Jun. 6, 2001

(65) Prior Publication Data

US 2001/0053676 A1    Dec. 20, 2001

(30) Foreign Application Priority Data

Jun. 19, 2000  (JP)  ............... 2000-183626

(51) Int. Cl.
*H04B 1/02* (2006.01)
(52) U.S. Cl. .................... 455/93; 455/75; 455/76
(58) Field of Classification Search ............ 455/75, 455/76, 77, 78, 93
See application file for complete search history.

(56) References Cited

U.S. PATENT DOCUMENTS

| | | | |
|---|---|---|---|
| 5,406,615 A | | 4/1995 | Miller, II et al. |
| 5,732,330 A | * | 3/1998 | Anderson et al. .............. 455/76 |
| 5,966,666 A | * | 10/1999 | Yamaguchi et al. ...... 455/552.1 |
| 5,974,302 A | | 10/1999 | Adamiecki et al. |
| 6,064,665 A | | 5/2000 | Leuck et al. |

FOREIGN PATENT DOCUMENTS

| | | |
|---|---|---|
| EP | 0 851 598 A2 | 7/1998 |
| EP | 0 926 838 A1 | 6/1999 |
| JP | 10-178375 | 6/1998 |
| JP | 2000-40969 | 2/2000 |
| JP | 3063346 | 5/2000 |
| JP | 2002-517121 | 6/2002 |
| WO | WO 98/00927 | 1/1998 |

OTHER PUBLICATIONS

UK Examination Report dated Jul. 24, 2003.

* cited by examiner

*Primary Examiner*—Bing Q. Bui
(74) *Attorney, Agent, or Firm*—Scully, Scott, Murphy & Presser

(57) ABSTRACT

The power amplification circuit for a communication device includes an initial-stage amplifier for amplifying a modulation signal of a predetermined frequency band, a first amplification system having a subsequent-stage amplifier and a final-stage amplifier for amplifying power of an amplified output of the initial-stage amplifier without modification and outputting the amplified output as a first transmission signal, and a second amplification system having a frequency conversion circuit composed of a local oscillation circuit and a mixing circuit for converting an amplified output of the initial-stage amplifier into a signal of a frequency band different from that of the first transmission signal and a subsequent-stage amplifier and a final-stage amplifier for amplifying power of an output signal of the frequency conversion circuit and outputting the amplified output as a second transmission signal.

7 Claims, 3 Drawing Sheets

FIG. 3

| | GSM900 | DCS1800 |
|---|---|---|
| OUTPUT FREQUENCY OF SIGNAL SOURCE 70 | 1710.2MHz | 1710.2MHz - 1784.8MHz |
| OUTPUT FREQUENCY OF LOCAL OSCILLATION CIRCUIT 140 | 795.4MHz - 820.0MHz | (DON'T OUTPUT) |
| INPUT FREQUENCY TO SUBSEQUENT-STAGE AMPLIFIER 120 OR 160 | 890.2MHz - 914.8MHz | 1710.2MHz - 1784.8MHz |
| TRANSMISSION FREQUENCY STANDARD OF DEVICE | 890.2MHz - 914.8MHz | 1710.2MHz - 1784.8MHz |

POWER AMPLIFICATION CIRCUIT FOR COMMUNICATION DEVICE

BACKGROUND OF THE INVENTION

1. Field of the Invention

The present invention relates to a power amplification circuit for a communication device, and more particularly, to a power amplification circuit for a communication device suitable for use in mobile communication.

2. Description of the Related Art

In the field of mobile communication in recent years, there is a sharp increase in traffic because portable terminals have been widely used and therefore a plurality of communication systems exist whose frequency bands are largely apart from each other.

In order to improve users' convenience, it is demanded by the market that these plurality of communication systems should be realized by one terminal device.

Under these circumstances, for the transmission and reception of signals at a plurality of communication systems, it is desirable in terms of costs and mounting areas, rather than that one terminal device is mounted with a plurality of circuits for transmitting and receiving signals whose frequencies for use are largely apart from each other as many as the number of communication systems, that a part of the circuit is shared. This is obvious because the market demand trends toward terminal down-sizing.

Presented as a conventional example of a power amplification circuit for a communication device capable of transmitting signals of a plurality of frequency bands is an example of a power amplification circuit structure shown in FIG. 4 or 5.

A power amplification circuit 400 shown in FIG. 4 is structured such that an initial-stage amplifier 401 for amplifying power of a modulation signal output from a signal source 470 is used in common by two frequency bands and at the subsequent stages, a transmission signal of one frequency band has its power amplified by amplifiers 402 and 403 and a transmission signal of the other frequency band has its power amplified by amplifiers 404 and 405 and the amplified signals are output as external signals.

On the other hand, a conventional power amplification circuit 500 shown in FIG. 5 is structured such that two amplification systems completely independent of each other, that is, an amplification system composed of amplifiers 501, 502 and 503 for amplifying an output signal of a signal source 580 and an amplification system composed of amplifiers 511, 512 and 513 for amplifying an output signal of a signal source 590, respectively amplify power of the output signals of the signal sources 580 and 590 which output signals whose frequency bands are apart from each other and respectively output these amplified outputs as independent transmission signals.

Although the conventional power amplification circuit shown in FIG. 4 has a less number of components than that of a power amplification circuit according to an embodiment of the present invention which will be described later, when two frequency bands are apart from each other as described above, it is extremely difficult with respect to the two frequency bands to ensure high efficiency of power amplification at the initial-stage amplifier 401, whereby frequency characteristics (amplification characteristics) of one of the frequency band is largely limited.

The conventional power amplification circuit shown in FIG. 5, unlike the power amplification circuit shown in FIG. 4, enables optimization of the frequency characteristics of the initial-stage amplifiers 501 and 511 in the respective frequency bands.

However, as much space for a semiconductor die of the initial-stage amplifier and a matching circuit and the like to be formed preceding thereto is as a matter of course needed as a space equivalent to the number of frequency bands. This is not desirable in terms of costs and size.

As described in the foregoing, a power amplification circuit for use in a conventional communication device, in a case where the communication device has a plurality of transmission frequency bands, is provided with a plurality of the same circuits even though a circuit size is increased or has the circuit partly shared while sacrificing amplification efficiency in a certain frequency band.

SUMMARY OF THE INVENTION

An object of the present invention, in consideration of such circumstances, is to provide a power amplification circuit for a communication device which enables power amplification in all transmission frequency bands with high efficiency without increasing a circuit scale.

According to one aspect of the invention, a power amplification circuit for a communication device having a plurality of transmission frequency bands, wherein a modulation signal of a predetermined frequency band output from a single signal source is converted into transmission signals of a plurality of frequency bands and the transmission signals are output.

In the preferred construction, when outputting the transmission signal of the same frequency as that of the signal of the signal source, the signal of the signal source has power amplified without modification and output as a transmission signal, and when outputting the transmission signal of a frequency different from that of the signal of the signal source, the signal of the signal source is frequency-converted and has power amplified and output as a transmission signal.

In another preferred construction, the power amplification circuit for a communication device further comprises a first amplification system for amplifying power of the modulation signal of a predetermined frequency band output from the single signal source without modification and outputting the amplified signal as a first transmission signal, and a second amplification system for converting the modulation signal of a predetermined frequency band output from the single signal source into a signal of a frequency band different from that of the first transmission signal, amplifying power of the converted signal and outputting the amplified output as a second transmission signal.

In another preferred construction, a plurality of the second amplification systems are provided to output transmission signals of a plurality of frequency bands not less than three kinds.

According to another aspect of the invention, a power amplification circuit for a communication device having a plurality of transmission frequency bands, comprises a first amplification system for amplifying power of a modulation signal of a predetermined frequency band output from a single signal source without modification and outputting the amplified signal as a first transmission signal, and a second amplification system for converting the modulation signal of a predetermined frequency band output from the single signal source into a signal of a frequency band different from that of the first transmission signal, amplifying power of the converted signal and outputting the amplified output as a second transmission signal.

In the preferred construction, the second amplification system includes a local oscillation circuit for outputting a signal of a frequency band for the conversion into a frequency band different from a predetermined frequency band of the modulation signal output from the single signal source, and a mixing circuit for mixing a signal whose frequency band is the same as that of the modulation signal output from the single signal source and an oscillation output of the local oscillation circuit.

In another preferred construction, the power amplification circuit for a communication device further comprises an initial-stage amplifier for amplifying power of the modulation signal of a predetermined frequency band output from the single signal source without modification.

In another preferred construction, a plurality of the second amplification systems are provided to output transmission signals of a plurality of frequency bands not less than three kinds.

In another preferred construction, the power amplification circuit for a communication device further comprises an initial-stage amplifier for amplifying power of the modulation signal of a predetermined frequency band output from the single signal source without modification, wherein the first amplification system includes an amplifier for amplifying power of an output of the initial-stage amplifier without modification and outputting the amplified output as the first transmission signal, and the second amplification system includes a local oscillation circuit for outputting a signal of a frequency band for converting an output signal of the initial-stage amplifier to have a frequency band different from a predetermined frequency band, a mixing circuit for mixing a signal whose frequency band is the same as that of the modulation signal output from the single signal source and an oscillation output of the local oscillation circuit, and an amplifier for amplifying power of an output of the mixing circuit and outputting the amplified output as the second transmission signal.

In another preferred construction, the power amplification circuit for a communication device further comprises an initial-stage amplifier for amplifying power of the modulation signal of a predetermined frequency band output from the single signal source without modification, wherein the second amplification system includes a local oscillation circuit for outputting a signal of a frequency band for converting an output signal of the initial-stage amplifier to have a frequency band different from a predetermined frequency band, a mixing circuit for mixing a signal whose frequency band is the same as that of the modulation signal output from the single signal source and an oscillation output of the local oscillation circuit, and a subsequent-stage amplifier and a final-stage amplifier for amplifying power of an output of the mixing circuit and outputting the amplified output as the second transmission signal.

In another preferred construction, the power amplification circuit for a communication device further comprises an initial-stage amplifier for amplifying power of the modulation signal of a predetermined frequency band output from the single signal source without modification, wherein the first amplification system includes a subsequent-stage amplifier and a final-stage amplifier for amplifying power of an output of the initial-stage amplifier without modification and outputting the amplified output as the first transmission signal.

In another preferred construction, the power amplification circuit for a communication device further comprises an initial-stage amplifier for amplifying power of the modulation signal of a predetermined frequency band output from the single signal source without modification, wherein the first amplification system includes a subsequent-stage amplifier and a final-stage amplifier for amplifying power of an output of the initial-stage amplifier without modification and outputting the amplified output as the first transmission signal, and the second amplification system includes a local oscillation circuit for outputting a signal of a frequency band for converting an output signal of the initial-stage amplifier to have a frequency band different from a predetermined frequency band, a mixing circuit for mixing a signal whose frequency band is the same as that of the modulation signal output from the single signal source and an oscillation output of the local oscillation circuit, and a subsequent-stage amplifier and a final-stage amplifier for amplifying power of an output of the mixing circuit and outputting the amplified output as the second transmission signal.

According to a power amplification circuit for a communication device of the present invention, since a power amplification circuit for a communication device having a plurality of transmission frequency bands is structured to convert a modulation signal of a predetermined frequency band output from a single signal source into transmission signals of a plurality of frequency bands and output the transmission signals, amplification characteristics of an initial-stage amplifier can be optimized to some extent in a narrow band, thereby preventing extreme deterioration of amplification efficiency in any of the plurality of transmission frequency bands to reduce current consumption of the communication device.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 3 is an explanatory diagram showing a frequency scheme of the power amplification circuit shown in FIG. 2;

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
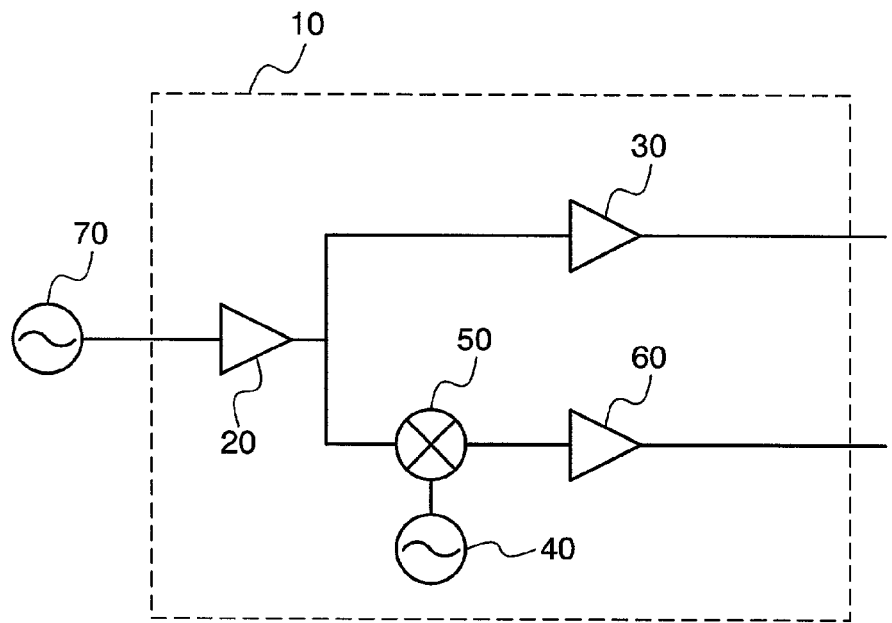
FIG. 1 is a block diagram showing a basic structure of a power amplification circuit for a communication device according to the present invention.

Basic structure of a power amplification circuit for a communication device according to the present invention is shown in FIG. 1.

In FIG. 1, a power amplification circuit 10 serves to amplify power of transmission signals of a plurality of frequency bands different from each other and output the amplified signals and includes an initial-stage amplifier 20 for amplifying power of a modulation signal of a predetermined frequency band output from a signal source 70, an amplifier 30 for amplifying power of an amplified output of the initial-stage amplifier 20 without modification and outputting the amplified output as a first transmission signal, a local oscillation circuit 40 and a mixing circuit 50 for frequency-converting an output signal of the initial-stage amplifier 20 into a signal of a frequency band different from the predetermined frequency band, and an amplifier 60 for amplifying power of an output signal of the mixing circuit 50 and outputting the amplified output as a second transmission signal.

Since the above-described power amplification circuit is thus structured such that a modulation signal of a predetermined frequency band output from the single signal source 70 is converted into and output as transmission signals of a plurality of frequency bands, highly efficient power amplification in a plurality of frequency bands largely apart from each other is possible even though it has a single input structure.

Although shown in FIG. 1 is a case where the number of transmission signals of a plurality frequency bands different from each other is two for the convenience of explanation, the number is not limited thereto. By connecting a plurality of amplification systems including a frequency conversion means composed of a local oscillation circuit and a mixing circuit to the output side of the initial-stage amplifier 20, highly efficient power amplification of transmission signals of a plurality of frequency bands not less than three and output of the amplified signals can be realized without increasing a circuit scale.

Figure 2:
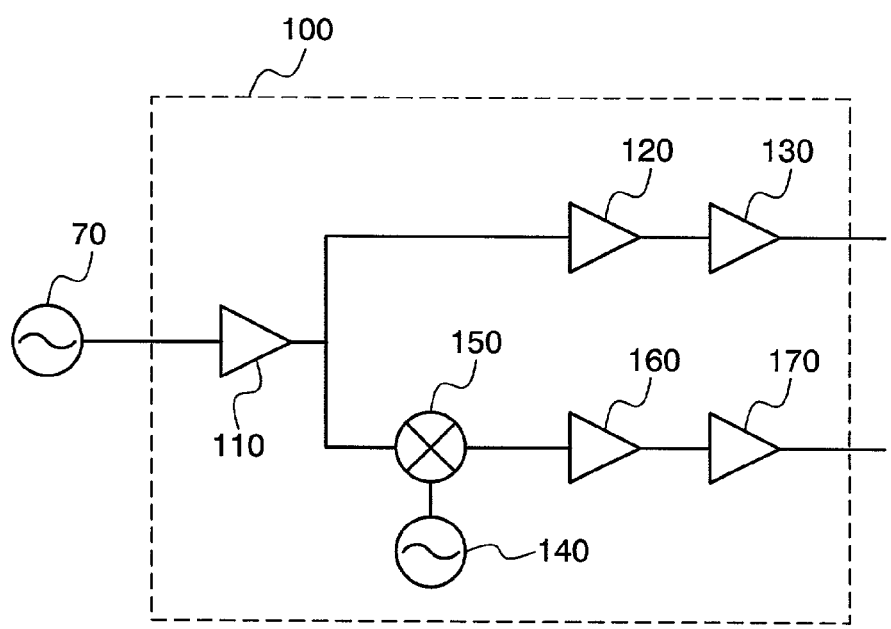
FIG. 2 is a block diagram showing a structure of a power amplification circuit according to an embodiment of the present invention.
Figure 4:
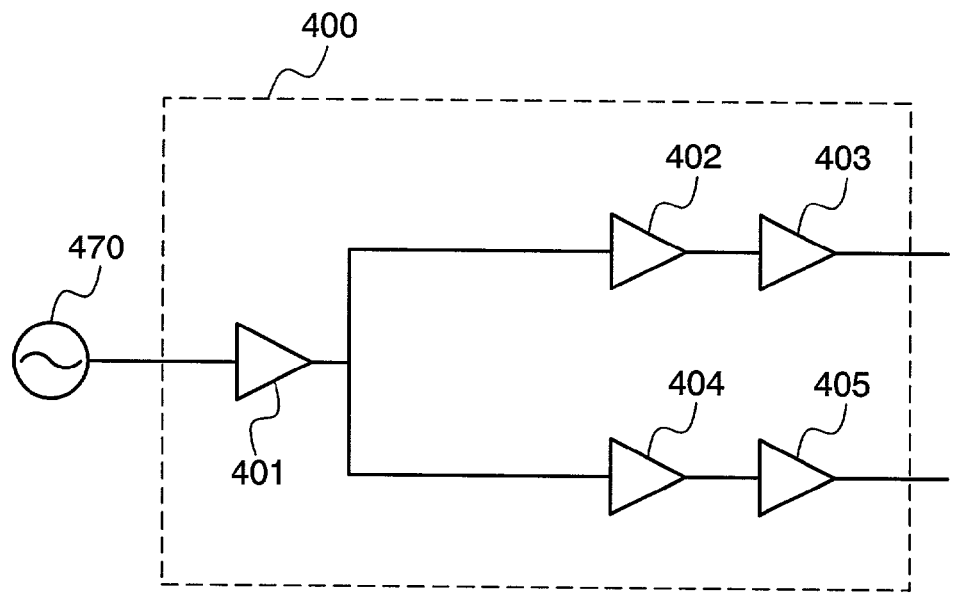
FIG. 4 is a block diagram showing one example of a structure of a power amplification circuit in a conventional communication device.
Figure 5:
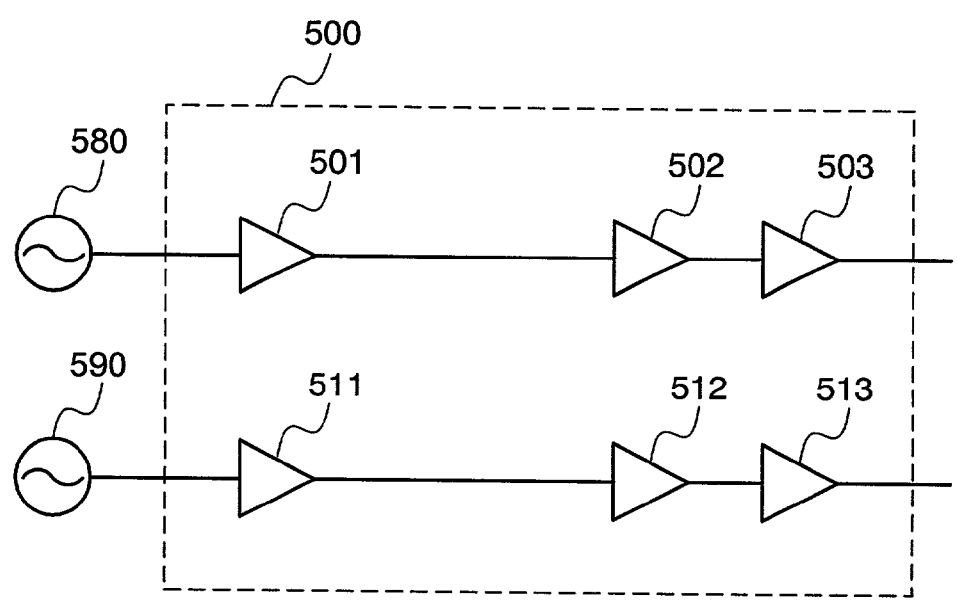
FIG. 5 is a block diagram showing another example of a structure of a power amplification circuit in a conventional communication device.

Next, shown in FIG. 2 is a structure of a power amplification circuit for a communication device according to an embodiment of the present invention. In FIG. 2, a power amplification circuit 100 is a power amplification circuit for a communication device having a plurality of transmission frequency bands and includes an initial-stage amplifier 110 for amplifying power of a modulation signal of a predetermined frequency band output from a single signal source 70, a first amplification system composed of a subsequent-stage amplifier 120 and a final-stage amplifier 130 for amplifying power of an amplified output of the initial-stage amplifier 110 without modification and outputting the amplified output as a first transmission signal, and a second amplification system composed of a frequency conversion circuit having a local oscillation circuit 140 and a mixing circuit 150 for converting an amplified output of the initial-stage amplifier 110 into a signal of a frequency band different from that of the first transmission signal, a subsequent-stage amplifier 160 and a final-stage amplifier 170 for amplifying power of an output signal of the frequency conversion circuit and outputting the amplified output as a second transmission signal.

In response to applied two signals, an output signal of the initial-stage amplifier 110 and an output signal of the local oscillation circuit 140, the mixing circuit 150 outputs a signal having a frequency equivalent to a difference between the two signals.

The signal source 70 has a function of generating a transmission signal and is mainly composed of a frequency synthesizer and a modulator to generate a modulation signal to be sent out in practice to the outside of the device through an aerial wire.

The local oscillation circuit 140 has a frequency set in advance such that when a frequency of an output signal of the signal source 70 and output frequencies of the subsequent-stage amplifier 160 and the final-stage-amplifier 170 are different from each other, a signal of a frequency equivalent to a different between them is generated.

In the above-described structure, a signal (modulation signal) output from the signal source 70 has its power amplified by the initial-stage amplifier 110. Here, when the signal source 70 and the final output signal (transmission signal) have the same frequency, the output of the initial-stage amplifier 110 is amplified by the subsequent-stage amplifier 120 and the final-stage amplifier 130 and then externally sent out as an output of the power amplification circuit 100 itself.

On the other hand, when the signal source 70 and the final output signal have different frequencies, the output signal of the initial-stage amplifier 110 is frequency-converted by the local oscillation circuit 140 and the mixing circuit 150 to have a frequency band different from that of the frequency of the signal source 70 and the output signal of the mixing circuit 150 has its power amplified by the subsequent-stage amplifier 160 and the final-stage amplifier 170, so that the amplified signal is externally sent out as an output signal of the power amplification circuit 100 itself.

FIG. 3 shows an example of a transmission frequency of the communication device according to the embodiment of the present invention, which is conforming to the GSM transmission frequency standard used in portable telephones in Europe and the like. This standard has two transmission frequency bands, GSM900 in the vicinity of 900 MHz and DCS1800 in the vicinity of 1800 MHz. Market demands one portable telephone to conduct transmission in the two frequency bands.

In the embodiment of the present invention, the initial-stage amplifier 110 is adjusted so as to conduct amplification most efficiently in the frequency band of DCS1800, and transmission using the frequency band of GSM900 is conducted through the mixing circuit 150.

According to the above arrangement, frequency characteristics (amplification characteristics) of the subsequent-stage amplifier 120 and the final-stage amplifier 130 are optimized in the frequency band of DCS1800, while frequency characteristics of the subsequent-stage amplifier 160 and the final-stage amplifier 170 are optimized in the frequency band of GSM 900.

When such a power amplification circuit is structured mainly using GaAs devices, it is extremely difficult to conduct power amplification of frequency characteristics of the initial-stage amplifier 110 in a broad band with high efficiency.

Therefore, both in a case where a frequency band of GSM900 is used and in a case where a frequency band of DCS1800 is used, arranging the initial-stage amplifier 110 to use the frequency band of DCS1800 enables the amplifier to realize optimization in a narrow band to a certain extent, so that deterioration of power amplification efficiency is reduced. This is the reason why such a frequency scheme as shown in FIG. 3 is selected in the embodiment of the present invention.

Expressions "frequency band of GSM900" and "frequency band of DCS1800" in the present embodiment represent frequency bands in the vicinity of 900 MHz and 1800 MHz, respectively, and place no limitations on the system of the present invention.

In addition, although in the present embodiment, a part of the transmission circuits of the two communication systems is shared, the number of bands of the transmission circuit is arbitrary.

Furthermore, in a case where transmission is conducted using the local oscillation circuit 140 and the mixing circuit 150 in the present embodiment, although a transmission frequency is converted with an output frequency of the signal source 70 fixed and an output frequency of the local oscillation circuit 140 set to be variable, a relation between a fixed frequency and a variable frequency may be reversed.

In the present embodiment, at the initial-stage amplifier 110, frequency characteristics, that is, amplification characteristics, are optimized in a frequency band of the DCS1800. This arrangement is made in consideration of the fact that when a frequency is high, an output level of the mixing circuit 150 lowers relatively. Without such a problem, a frequency band common to an initial-stage amplifier is not limited.

In addition, although the present embodiment is on the premise that a power amplification circuit is manufactured by a GaAs process, manufacturing process and the like of the semiconductor is not limited thereto.

As described in the foregoing, according to the power amplification circuit for a communication device of the present invention, since a power amplification circuit for a communication device having a plurality of transmission frequency bands is structured to convert a modulation signal of a predetermined frequency band output from a single signal source into transmission signals of a plurality of frequency bands and output the transmission signals, amplification characteristics of an initial-stage amplifier can be optimized to some extent in a narrow band, thereby preventing extreme deterioration of amplification efficiency in any of the plurality of transmission frequency bands to reduce current consumption of the communication device. More specifically, while the mixing circuit 150 and the local oscillation circuit 140 consume current to a certain extent, the amount of consumed current is much smaller than the amount of increase in current consumption caused by deterioration of amplification efficiency of the power amplification circuit.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A power amplification circuit for a communication device having a plurality of transmission frequency bands, comprising:
    a first amplification system for amplifying power of a modulation signal of a predetermined frequency band output from a single signal source without modification and outputting the amplified signal as a first transmission signal; and
    a second amplification system for converting the modulation signal of a predetermined frequency band output from said single signal source into a signal of a frequency band different from that of said first transmission signal, amplifying power of the converted signal and outputting the amplified output as a second transmission signal,
    wherein said second amplification system including a single local oscillation circuit for outputting a signal of a frequency band for the conversion into a frequency band different from a predetermined frequency band of the modulation signal output from said single signal source, and
    a single mixing circuit for mixing a signal whose frequency band is the same as that of the modulation signal output from said single signal source and an oscillation output of said local oscillation circuit.

2. The power amplification circuit for a communication device as set forth in claim 1, further comprising:
    an initial-stage amplifier for amplifying power of the modulation signal of a predetermined frequency band output from the single signal source without modification.

3. The power amplification circuit for a communication device as set forth in claim 1, wherein
    a plurality of said second amplification systems are provided to output transmission signals of a plurality of frequency bands not less than three kinds.

4. The power amplification circuit for a communication device as set forth in claim 1, further comprising:
    an initial-stage amplifier for amplifying power of the modulation signal of a predetermined frequency band output from the single signal source without modification, wherein
    said first amplification system including
    an amplifier for amplifying power of an output of said initial-stage amplifier without modification and outputting the amplified output as the first transmission signal, and
    said single local oscillation circuit of said second amplification system outputs a signal of a frequency band for converting an output signal of said initial-stage amplifier to have a frequency band different from a predetermined band,
    said second amplification system further comprising an amplifier for amplifying power of an output of said mixing circuit and outputting the amplified output as the second transmission signal.

5. The power amplification circuit for a communication device as set forth in claim 1, further comprising:
    an initial-stage amplifier for amplifying power of the modulation signal of a predetermined frequency band output from the single signal source without modification, wherein
    said single local oscillation circuit of said second amplification system outputs a signal of a frequency band for converting an output signal of said initial-stage amplifier to have a frequency band different from a predetermined frequency band,
    said second amplification system further comprising a subsequent-stage amplifier and a final-stage amplifier for amplifying power of an output of said mixing circuit and outputting the amplified output as the second transmission signal.

6. The power amplification circuit for a communication device as set forth in claim 1, further comprising:
   an initial-stage amplifier for amplifying power of the modulation signal of a predetermined frequency band output from the single signal source without modification, wherein
   said first amplification system includes
   a subsequent-stage amplifier and a final-stage amplifier for amplifying power of an output of said initial-stage amplifier without modification and outputting the amplified output as the first transmission signal.

7. The power amplification circuit for a communication device as set forth in claim 1, further comprising:
   an initial-stage amplifier for amplifying power of the modulation signal of a predetermined frequency band and output from the single signal source without modification, wherein
   said first amplification system including
   a subsequent-stage amplifier and final-stage amplifier for amplifying power of an output of said initial-stage amplifier without modification and outputting the amplified output as the first transmission signal, and
   said single local oscillation circuit of said second amplification system outputs a signal of a frequency band for converting an output signal of said initial-stage amplifier to have a frequency band different from a predetermined frequency band,
   said second amplification system further comprising a subsequent-stage amplifier and a final-stage amplifier for amplifying power of an output of said mixing circuit and outputting the amplified output as the second transmission signal.

* * * * *